United States Patent
Wu et al.

(10) Patent No.: US 10,121,832 B1
(45) Date of Patent: Nov. 6, 2018

(54) TOUCH DISPLAY DEVICE

(71) Applicant: HANNSTOUCH SOLUTION INCORPORATED, Tainan (TW)

(72) Inventors: Hsu-Ho Wu, Tainan (TW); Che-Yu Chuang, Tainan (TW); Ching-Feng Tsai, Tainan (TW); Wei-Hsuan Ho, Tainan (TW)

(73) Assignee: HANNSTOUCH SOLUTION INCORPORATED, Tainan (TW)

( * ) Notice: Subject to any disclaimer, the term of this patent is extended or adjusted under 35 U.S.C. 154(b) by 0 days.

(21) Appl. No.: 15/798,417

(22) Filed: Oct. 31, 2017

(30) Foreign Application Priority Data

Jul. 17, 2017 (CN) .......................... 2017 1 0581399

(51) Int. Cl.
| | |
|---|---|
| *H01L 27/32* | (2006.01) |
| *H01L 51/52* | (2006.01) |
| *G06F 3/041* | (2006.01) |
| *G09G 3/3225* | (2016.01) |

(52) U.S. Cl.
CPC .......... *H01L 27/323* (2013.01); *G06F 3/0412* (2013.01); *H01L 27/3272* (2013.01); *H01L 27/3276* (2013.01); *H01L 51/5246* (2013.01); *H01L 51/5284* (2013.01); *G06F 2203/04102* (2013.01); *G09G 3/3225* (2013.01); *H01L 2251/5338* (2013.01)

(58) Field of Classification Search
CPC ......... G06F 3/0412; G06F 2203/04102; H01L 51/5246; H01L 27/323; H01L 2251/5338; H01L 51/5284; H01L 27/3276; H01L 27/3272; G09G 3/3225

See application file for complete search history.

(56) References Cited

U.S. PATENT DOCUMENTS

| | | | |
|---|---|---|---|
| 2010/0201275 A1* | 8/2010 | Cok | G06F 3/0412 315/158 |
| 2014/0203245 A1* | 7/2014 | Gupta | H01L 51/5203 257/40 |
| 2016/0282987 A1* | 9/2016 | Choi | G06F 3/044 |
| 2017/0047393 A1* | 2/2017 | Bower | G06F 3/044 |

* cited by examiner

*Primary Examiner* — Muhammad N Edun
(74) *Attorney, Agent, or Firm* — CKC & Partners Co., Ltd.

(57) ABSTRACT

A touch display device includes an organic light emitting diode display panel and a touch panel. The organic light emitting diode display panel includes an organic light emitting diode array having a plurality of pixel regions and a non-pixel region surrounding the pixel regions. Each of the pixel regions has an organic light emitting diode unit thereon, and a metal wire is located in the non-pixel region. The touch panel includes a transparent substrate, a sensing electrode layer and a light-shading pattern. The sensing electrode layer and the light-shading pattern are disposed on the transparent substrate, and overlapped each other. An orthogonal projection of the light-shading pattern onto the organic light emitting diode array is in the non-pixel region, and overlap the metal wire.

20 Claims, 14 Drawing Sheets

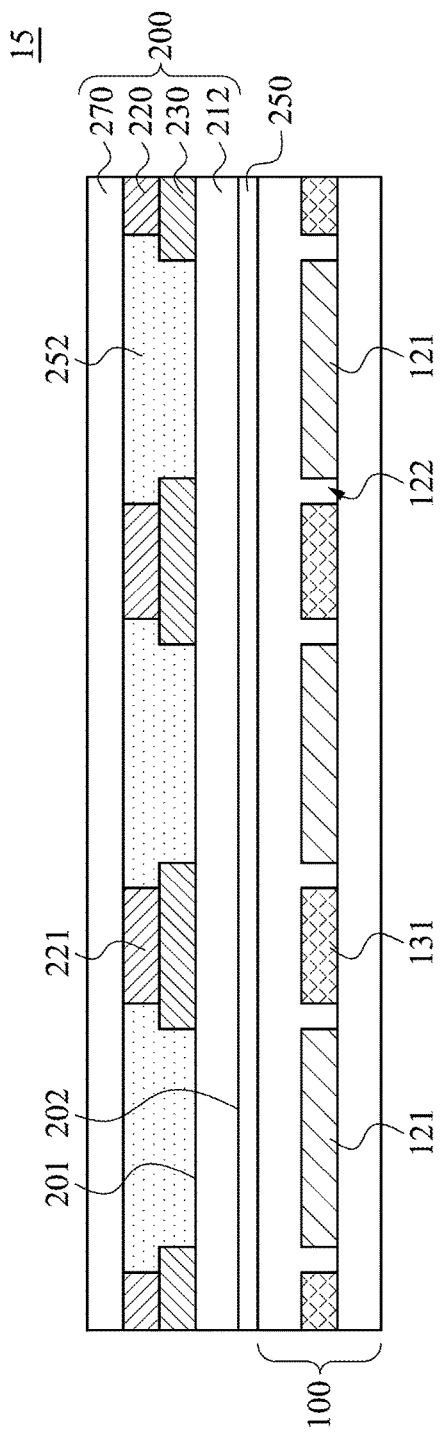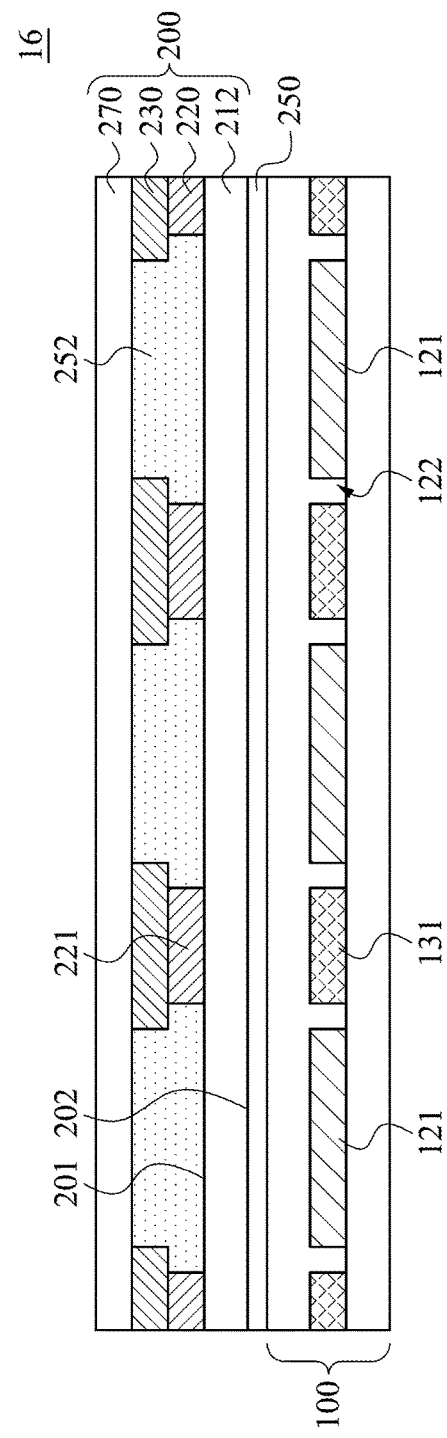

TOUCH DISPLAY DEVICE

RELATED APPLICATIONS

This application claims priority to China Application Serial Number 201710581399.0, filed Jul. 17, 2017, which is herein incorporated by reference.

BACKGROUND

Field of Disclosure

The present disclosure relates to a touch display device. More particularly, the present disclosure relates to an organic light emitting diode (OLED) touch display device.

Description of Related Art

An organic light emitting diode (OLED) display is a kind of flat-panel display, and the OLED display can be generally applied to a wide variety of optoelectronic devices. An OLED panel of the OLED display has following characteristics: light-weight, thin, high brightness, quick response, large viewing angle, no backlight, low manufacturing cost and flexibility. Therefore, the OLED display has been considered as the new generation of display types.

Since the metal wires between the OLED units of the OLED panel may cause light-reflecting because of the characteristics of metal, the visual taste and the visual contrast of the OLED display may be affected.

Therefore, the method to develop a solution to effectively overcome the aforementioned inconveniences and disadvantages is a serious concern for the industry.

SUMMARY

According to one embodiment, a touch display device includes an organic light emitting diode display panel and a touch panel. The organic light emitting diode display panel includes an organic light emitting diode array and a driving circuit. The organic light emitting diode array includes a plurality of pixel regions and a non-pixel region surrounding the pixel regions. Each of the pixel regions has an organic light emitting diode unit thereon. The driving circuit receives signals and drives the organic light emitting diode units to emit light. The driving circuit is provided with at least one metal wire, and the metal wire is located in the non-pixel region. The touch panel includes a transparent substrate, a sensing electrode layer and a light-shading pattern. The transparent substrate is coupled to the organic light emitting diode display panel. The sensing electrode layer is disposed on the transparent substrate. The light-shading pattern is disposed on the transparent substrate. An orthogonal projection of the light-shading pattern projected onto the organic light emitting diode array is in the non-pixel region, and overlaps with the metal wire. The light-shading pattern and the sensing electrode layer overlap each other.

Thus, through the above embodiments, only the metal wire arranged between the organic light emitting diode units is hidden beneath the light-shading pattern so that the visual taste and the visual contrast of the touch display device will not be affected.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

FIG. 6 is a partial sectional view of a touch display device according to one embodiment of the disclosure;

FIG. 7 is a partial sectional view of a touch display device according to one embodiment of the disclosure;

DESCRIPTION OF THE EMBODIMENTS

Figure 1A:
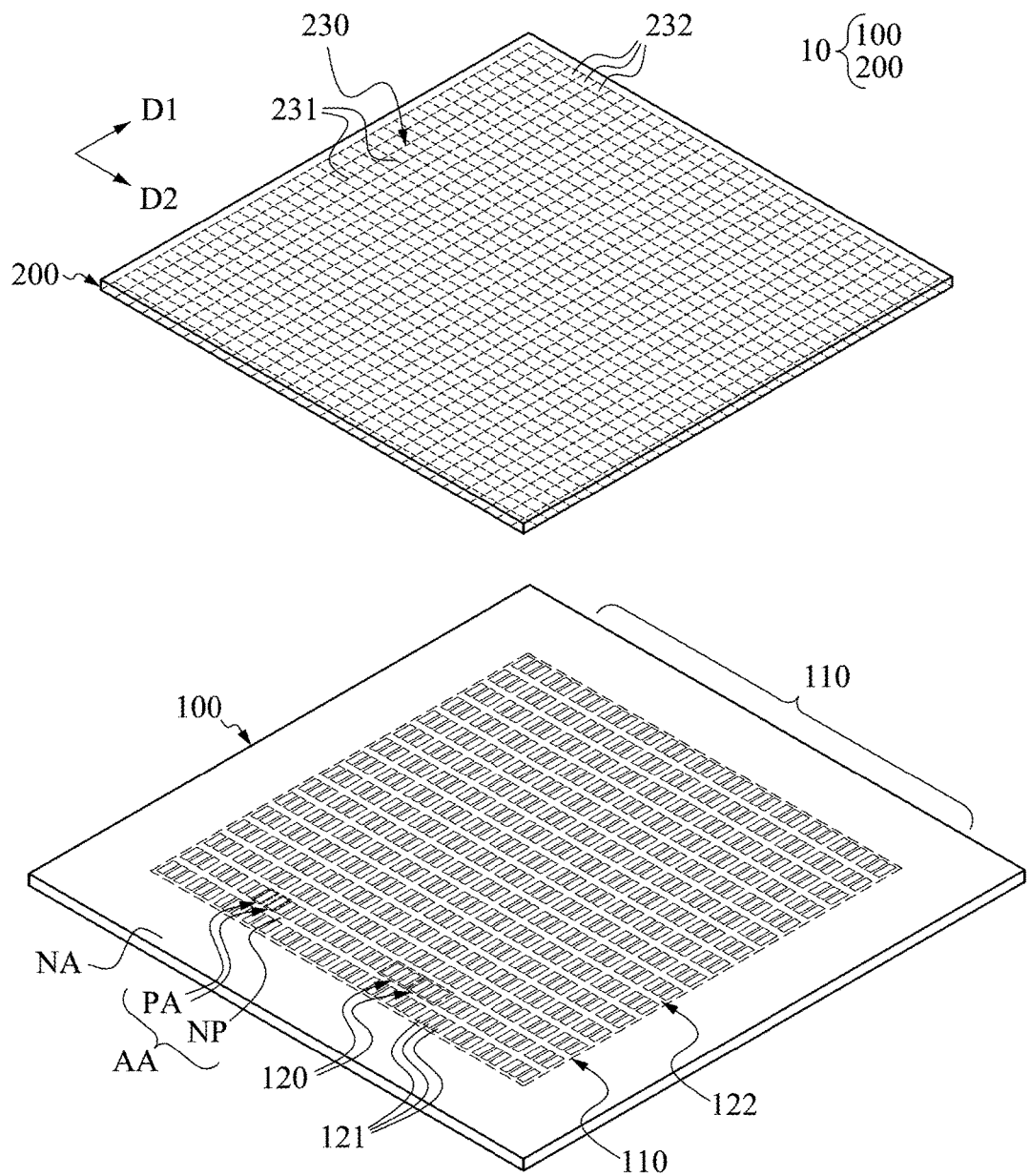
FIG. 1A is an exploded view of a touch display device according to one embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the disclosure.

The disclosure is to provide a touch display device in which a light-shading pattern is disposed in a touch panel of the touch display device so that a light-reflecting object (e.g., metal wire) can be hidden beneath the light-shading pattern, thus, the visual taste and the visual contrast of the touch display device will not be affected.

Figure 1B:
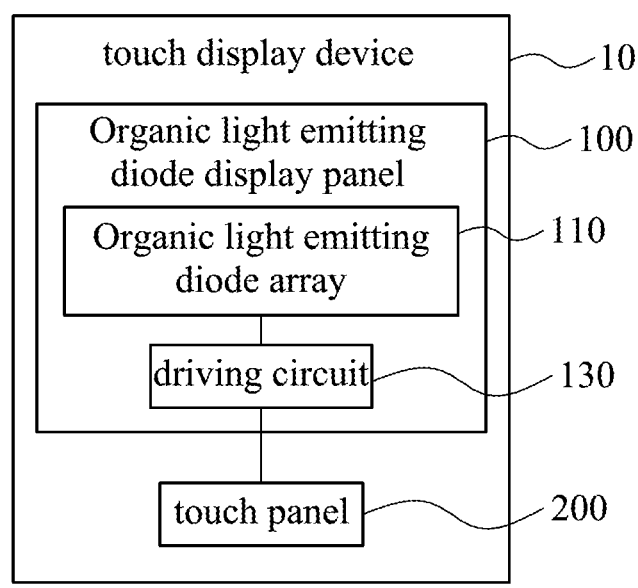
FIG. 1B is an electronic block diagram of the touch display device of FIG. 1A.
Figure 2A:
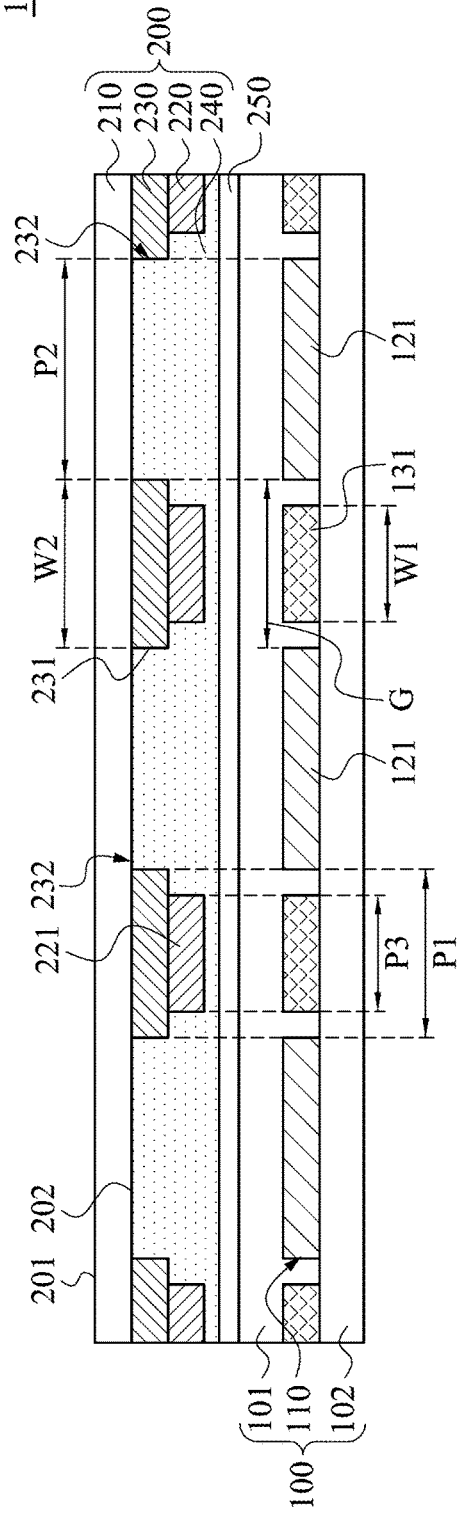
FIG. 2A is a partial sectional view of the touch display device of FIG. 1A.

Reference is now made to FIG. 1A to FIG. 2A in which FIG. 1A is an exploded view of a touch display device 10 according to one embodiment of the disclosure, FIG. 1B is an electronic block diagram of the touch display device 10 of FIG. 1A, and FIG. 2A is a partial sectional view of the touch display device 10 of FIG. 1A. As shown in FIG. 1A to FIG. 2A, the touch display device 10 includes an organic light emitting diode display panel 100 and a touch panel 200. The organic light emitting diode display panel 100 includes an organic light emitting diode array 110 and a driving circuit 130. The organic light emitting diode array 110 includes a plurality of pixel regions PA and a non-pixel region NP surrounding the pixel regions PA. The organic light emitting diode array 110 is provided with a plurality of organic light emitting diode units 121. The organic light emitting diode units 121 are spaced and arranged in the organic light emitting diode array 110, and respectively correspondingly located in the pixel regions PA one to one. An interstice formed among all of the organic light emitting diode units 121 is defined to be the non-pixel region NP. The driving circuit 130 is electrically connected to the organic light emitting diode array 110 for receiving signals and driving the organic light emitting diode units 121 to light. The driving circuit 130 includes a plurality of metal wires 131. The metal wires 131 are located in the non-pixel region NP. The touch panel 200 is coupled to the organic light emitting diode display panel 100 for a user to touch the touch panel 200 in response to the contents on the organic light emitting diode display panel 100. The touch panel 200 includes a transparent substrate 210, a sensing electrode layer 220 and a light-shading pattern 230. The transparent substrate 210 is coupled to the organic light emitting diode display panel 100. The sensing electrode layer 220 and the light-shading pattern 230 are disposed on the transparent substrate 210, and the sensing electrode layer 220 and the light-shading pattern 230 overlap each other. An orthogonal projection P1 of the light-shading pattern 230 projected onto the organic light emitting diode array 110 is disposed between any two of the organic light emitting diode units 121, that is, the orthogonal projection P1 is in the non-pixel region NP (FIG. 1). The orthogonal projection P1 at least overlaps the metal wires 131 located in the non-pixel region NP (FIG. 1), and does not overlap any one of the organic light emitting diode units 121. However, the disclosure is not limited thereto, in another embodiment, an orthogonal projection of the light-shading pattern projected onto the organic light emitting diode array may partially overlap one of the organic light emitting diode units.

Therefore, when a user examines the touch panel 200 of the organic light emitting diode display panel 100, the metal wires 131 arranged between the organic light emitting diode units 121 are exactly hidden beneath the light-shading pattern 230, and the organic light emitting diode units 121 are exposed outwardly from the light-shading pattern 230 so that the light-shading pattern 230 cannot block the organic light emitting diode units 121.

Specifically, as shown in FIG. 1A, the organic light emitting diode display panel 100 further includes an active area AA and a non-display area NA surrounding the active area AA. The active area AA includes the pixel regions PA and the non-pixel region NP. The organic light emitting diode array 110 is provided with a plurality of pixel electrodes 120 which are arranged in a matrix arrangement. Each of the pixel electrodes 120 includes three sub-pixels (i.e., red sub-pixel, green sub-pixel and blue sub-pixel). Each of the three sub-pixels is considered as one of the organic light emitting diode units 121, and correspondingly aligned with one of the pixel regions PA.

As shown in FIG. 2A, the organic light emitting diode display panel 100 further includes an encapsulation layer 101, a lower substrate 102 and an edge sealant (not shown in figures). The lower substrate 102 and the transparent substrate 210 are opposite to each other, and the lower substrate 102 is parallel to the transparent substrate 210. The material of the lower substrate 102 and the transparent substrate 210 for example can be glass, transparent acrylic plate (e.g., polyethylene terephthalate, PET) or other flexible materials such as polyimide (PI) etc. The organic light emitting diode array 110 is received in a space defined by the encapsulation layer 101, the lower substrate 102 and the edge sealant (not shown in figures). The metal wires 131 are disposed on the lower substrate 102 (FIG. 2A). The metal wires 131 are interleaved with each other, and the metal wires 131 are distributed in the non-pixel region NP defined by the interstice formed among the organic light emitting diode units 121. For example, the metal wires 131 can be scan lines, data lines and power lines (not shown in figures). Since the pixel electrodes, the scan lines, the data lines, the power lines and thin-film transistors (TFT) of the organic light emitting diode display panel 100 are well-known in the related field of the organic light emitting diode displays, the disclosure is not repeated herein and not illustrated in the drawings.

In the embodiment, back to FIG. 1A, the non-pixel region NP on the organic light emitting diode array 110 has an interval pattern. A pattern of the light-shading pattern 230 is substantially identical to the interval pattern of the non-pixel region NP, that is, the interval pattern of the non-pixel region NP is the same as the pattern of the light-shading pattern 230 in both of contour and size. However, the disclosure is not limited thereto, in another embodiment, as long as the light-shading pattern conceals the metal wires, the pattern of the light-shading pattern is not necessary to be identical to the interval pattern of the non-pixel region NP. For example, a pattern of the light-shading pattern is identical to a pattern of the metal wires, or an area of the light-shading pattern is smaller than the interval pattern of the non-pixel region but the area of the light-shading pattern is large enough to at least cover the metal wires.

The light-shading pattern 230, for example, is a mesh structure, and the light-shading pattern 230 is formed by a plurality of light-shading lines 231. The light-shading lines 231 extend in a first direction D1 and a second direction D2, respectively, so as to define a plurality of light-transmitting openings 232. The first direction D1 and the second direction D2 are orthogonal to each other, and the light-transmitting openings 232 are spaced and arranged according to a matrix arrangement. An orthogonal projection P2 of each of the organic light emitting diode units 121 overlapped on the transparent substrate 210 is in one of the light-transmitting openings 232 (FIG. 2A).

Furthermore, a gap G is formed between any two neighboring ones of the organic light emitting diode units 121. The metal wire 131 has a first line width W1, and any of the light-shading lines 231 has a second line width W2. The second line width W2 is not smaller than the first line width W1, and is not greater than the gap G formed between any two neighboring ones of the organic light emitting diode units 121. For example, in the embodiment, when the second line width W2 is substantially the same as the gap G, the light-shading line 231 can block reflected lights with larger reflection angle, however, the disclosure is not limited thereto, the first line width also can be configured to be substantially the same as the second line width in other requirements and limitations.

In the embodiment, the light-shading pattern 230 includes material with a light-blocking function; in other words, the light-shading pattern 230 includes opaque material such as ink, color photoresist, organic materials, inorganic materials or other similar materials with opaque or low light-transmissive features. The light-shading pattern 230 for example can be a black matrix (BM), however, the disclosure is not limited thereto, and not limited to black color. Also, the light-shading pattern 230 can be formed on a corresponding position of the transparent substrate 210 with directly printing, coating, metal deposition or other known technical means.

In another embodiment, the light-shading pattern includes light-absorbing material, for example, black light-absorbing material. Accordingly, the light-shading pattern can absorb the reflected lights from metal wires so as to reduce the visibility of the metal wires within the organic light emitting diode display panel 100. However, the present disclosure is not limited thereto.

In another embodiment, the light-shading pattern includes material with low light transmittance, such as ceramic material or organic material having carbon black therein. For example, transmittance of the light-shading pattern can be configured to be not greater than 15%, that is, 0-15%. In another embodiment, the light transmittance of the light-shading pattern is preferably configured to be 3% to 10%. Accordingly, the light-shading pattern can reduce the reflected lights of the metal wires passing through the touch panel so as to reduce the visibility of the metal wires within the organic light emitting diode display panel. However, the disclosure is not limited thereto.

In the embodiment, the touch panel 200 further includes a protection layer 240. The protection layer 240 covers the transparent substrate 210, the sensing electrode layer 220, and the light-shading pattern 230 so as to cover, fix and protect the sensing electrode layer 220 and the light-shading pattern 230. The protection layer 240 is bonded on the organic light emitting diode display panel 100 through an adhesive layer 250 (e.g., adhesive paste, optical clear adhesive, water glue or alike materials). However, the disclosure is not limited thereto, in another embodiment, the aforementioned protection layer can be omitted if the aforementioned encapsulation layer is used to collectively encapsulate the touch panel and the organic light emitting diode display panel together.

Moreover, the touch display device further is provided with a suitable polarizing plate (not shown in figures) over an upper substrate (e.g., transparent substrate) of the touch display device for further improving the light-blocking ability of the reflected lights, however, the disclosure is not limited thereto. In another embodiment, since the light-shading pattern conceals metal wires in the active area of the organic light emitting diode display panel, the metal wires cannot be viewed from the touch display device by a user. Thus, the disclosure can be selected to reduce the quantity of the polarizing plates, thereby reducing the material costs and the overall thickness, and also not reducing the luminous brightness of the touch display device itself.

As shown in FIG. 2A, the light-shading pattern 230 is disposed on one surface of the transparent substrate 210 facing towards the organic light emitting diode array 110, and the light-shading pattern 230 is disposed between the transparent substrate 210 and the sensing electrode layer 220. Therefore, since the light-shading pattern 230 is disposed on the surface of the transparent substrate 210 facing towards the organic light emitting diode array 110, not the other surface of the transparent substrate 210 facing away the organic light emitting diode array 110, thus, the light-shading pattern 230 is closer to the organic light emitting diode array 110, so as to block larger angles of lights to improve the shading effectiveness.

Specifically, the transparent substrate 210 of the touch panel 200 includes a front surface 201 and a rear surface 202 which are opposite to each other. The light-shading pattern 230 is directly formed on the rear surface 202 of the transparent substrate 210, and the sensing electrode layer 220 is directly formed on one surface of the light-shading pattern 230 opposite to the transparent substrate 210. On the other words, after the light-shading pattern 230 is formed on the rear surface 202 of the transparent substrate 210, the sensing electrode layer 220 is formed on the light-shading pattern 230. Furthermore, the sensing electrode layer 220 includes a plurality of electrode parts 221. Each of the electrode parts 221 is also hidden beneath the light-shading pattern 230. On the other words, an orthogonal projection P3 of each of the electrode parts 221 projected onto the organic light emitting diode array 110 is also disposed within the scope of the orthogonal projection P1 of the light-shading pattern 230, that is, P3 is smaller or equal to P1, and a line width of each of the electrode parts is smaller or equal to a line width of each of the light-shading lines. Thus, when a user examines the touch panel 200, the electrode parts 221 of the sensing electrode layer 220 will not be viewed by the user even if the sensing electrode layer 220 includes metal material. However, the disclosure is not limited thereto, in another embodiment, the sensing electrode layer may also contain, for example, ITO (indium tin oxide), silver nano wire, carbon nano tube, conductive polymer (e.g., PEDOT/PSS), metal mesh, graphite Alkene or alike.

Furthermore, the transparent substrate 210 can directly be a cover lens which is the outermost layer of the touch panel 200 for protecting the sensing electrode layer 220 and the light-shading pattern 230 of the touch panel 200. The transparent substrate 210 is a hard material. For example, the transparent substrate 210 is a transparent thin sheet made of glass or plastic. The plastic is polycarbonate (PC), polyester (PET), polymethylmethacrylate (PMMA) or cycloolefin copolymer (COC), for example. However, the disclosure is not limited thereto.

Figure 2B:
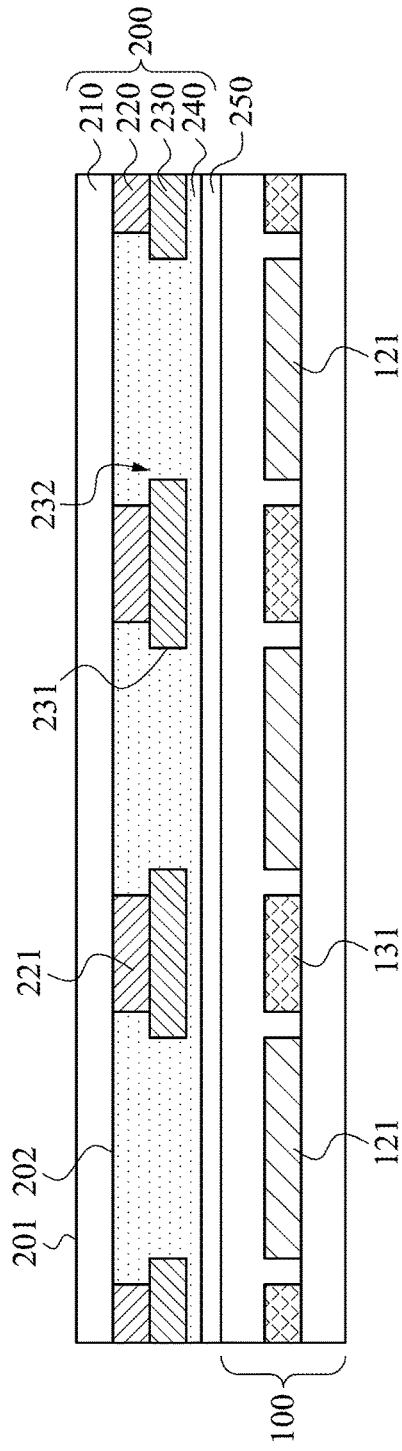
FIG. 2B is a partial sectional view of a touch display device according to one embodiment of the disclosure.

FIG. 2B is a partial sectional view of a touch display device 11 according to one embodiment of the disclosure. In the embodiment, the touch display device 11 of FIG. 2B and the touch display device 10 of FIG. 2A are substantially the same, except that the sensing electrode layer 220 of FIG. 2B is disposed between the transparent substrate 210 and the light-shading pattern 230, rather than the light-shading pattern 230 is disposed between the transparent substrate 210 and the sensing electrode layer 220. Specifically, the sensing electrode layer 220 is directly formed on the rear surface 202 of the transparent substrate 210, and the light-shading pattern 230 is directly formed on one surface of the sensing electrode layer 220 facing towards the transparent substrate 210.

Specifically, the sensing electrode layer 220 is directly formed on the rear surface 202 of the transparent substrate 210, and the light-shading pattern 230 is directly formed on one surface of the sensing electrode layer 220 opposite to the transparent substrate 210. On the other words, after the sensing electrode layer 220 is formed on the rear surface 202 of the transparent substrate 210, the light-shading pattern 230 is then formed on the sensing electrode layer 220. The sensing electrode layer 220 includes a plurality of electrode parts 221. Each of the electrode parts 221 is disposed between the light-shading pattern 230 and the transparent substrate 210. On the other words, each of the electrode parts 221 is not hidden beneath the light-shading pattern 230. Thus, the sensing electrode layer 220 may be selected as a light-transmissive material, for example, a transparent conductive oxide, nano silver, carbon nanotubes or graphene. The transparent conductive oxide is, for example, indium tin oxide, indium zinc oxide or zinc oxide aluminum.

Figure 3:
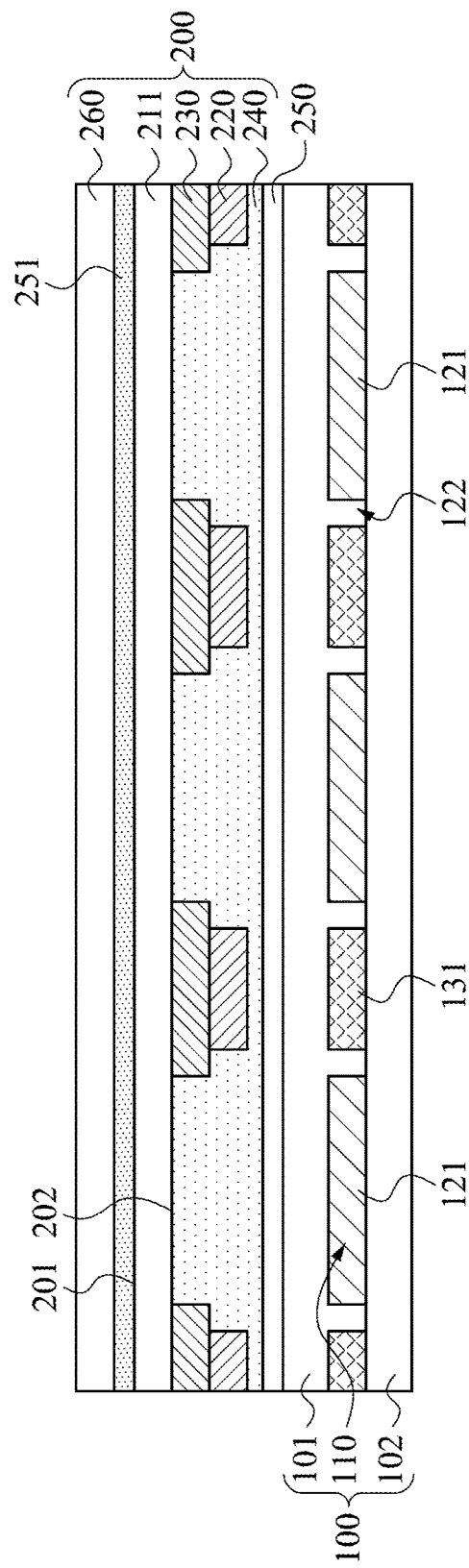
FIG. 3 is a partial sectional view of a touch display device according to one embodiment of the disclosure.

FIG. 3 is a partial sectional view of a touch display device 12 according to one embodiment of the disclosure. In the embodiment, the touch display device 12 of FIG. 3 and the touch display device 10 of FIG. 2A are substantially the same, except that the touch display device 12 of FIG. 3 further includes a hard coat layer 260. The hard coat layer 260 is disposed on one surface (i.e., the front surface 201) of the transparent substrate 211 opposite to the organic light emitting diode array 110 for protecting the transparent substrate 211. For example, the hard coat layer 260 is attached on the front surface 201 of the transparent substrate 211 through the adhesive layer 251, or the hard coat layer 260 is integrally formed on the front surface 201 of the transparent substrate 211 without any adhesive layer. Also, the hard coating layer of the embodiment also can be disposed on the front surface 201 of the transparent substrate 211 of FIG. 2B.

Figure 4:
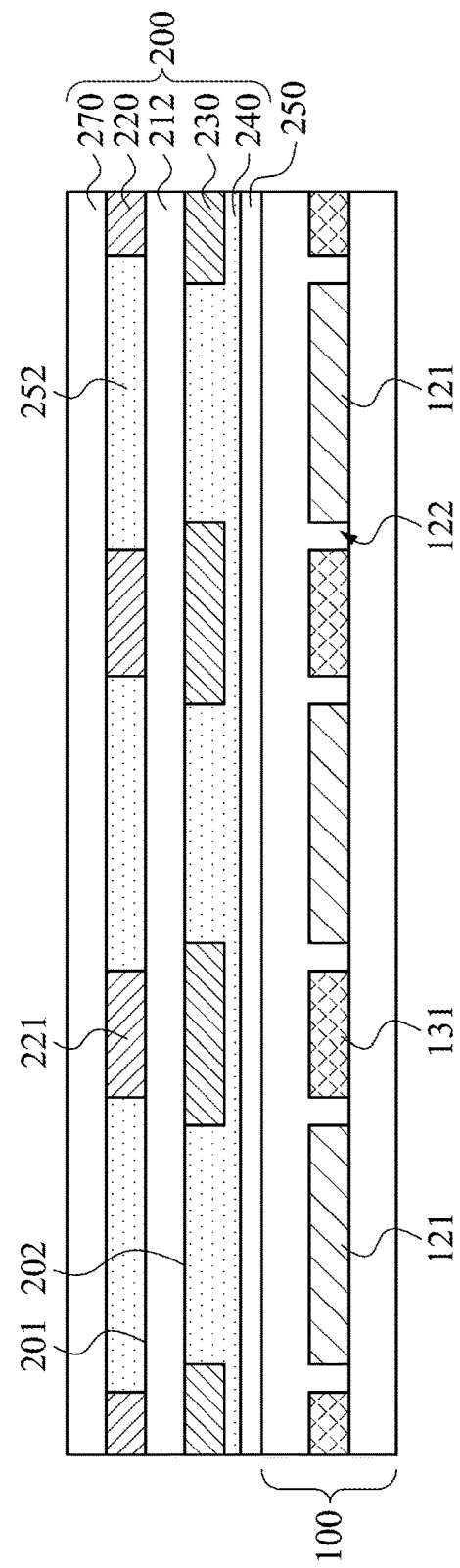
FIG. 4 is a partial sectional view of a touch display device according to one embodiment of the disclosure.

FIG. 4 is a partial sectional view of a touch display device 13 according to one embodiment of the disclosure. In the embodiment, the touch display device 13 of FIG. 4 and the touch display device 10 of FIG. 2A are substantially the same, except that the touch panel 200 further includes an outer layer. The outer layer is a protective cover 270, for example. The protective cover 270 covers one surface of the transparent substrate 212 opposite to the organic light emitting diode array 110, that is, the protective cover 270 covers the front surface 201 of the transparent substrate 212. The sensing electrode layer 220 is disposed between the protective cover 270 and the transparent substrate 212, and the transparent substrate 212 is disposed between the sensing electrode layer 220 and the light-shading pattern 230. For example, the light-shading pattern 230 is directly formed on the rear surface 202 of the transparent substrate 212, and the sensing electrode layer 220 is directly formed on the front surface 201 of the transparent substrate 212, and is directly sandwiched between the protective cover 270 and transparent substrate 212. Specifically, the transparent substrate 212 is a flexible film, however, the disclosure is not limited thereto. After the sensing electrode layer 220 and the light-shading pattern 230 are formed on the front surface 201 and the rear surface 202 of the transparent substrate 212, respectively, the transparent substrate 212 is attached on one surface of the protective cover 270 through an adhesive layer 252 (e.g., adhesive or other similar materials). However, the disclosure is not limited that the transparent substrate 212 must be the flexible film. Furthermore, since the electrode parts 221 of the sensing electrode layer 220 are not hidden beneath the light-shading pattern 230, the sensing electrode layer 220 may be selected as the aforementioned light-transmissive material such as indium tin oxide.

Moreover, in another embodiment, the protective cover is in a curved shape in a status without being deforming by an external force (not shown in figures). When the transparent substrate 212 is attached on a protective cover, since the transparent substrate 212 is a flexible film, the transparent substrate 212 must become bent (e.g., curved) to match the curvature of the curved protective cover for in order to be attached to one surface of the protective cover. However, in another embodiment, once a hardness of the transparent substrate is not enough, the outer layer described above can be selected as a hard coat layer. Thus, the hard coat layer can be attached on the transparent substrate with an adhesive layer for protecting the transparent substrate and the sensing electrode layer. However, the disclosure is not limited thereto.

Figure 5:
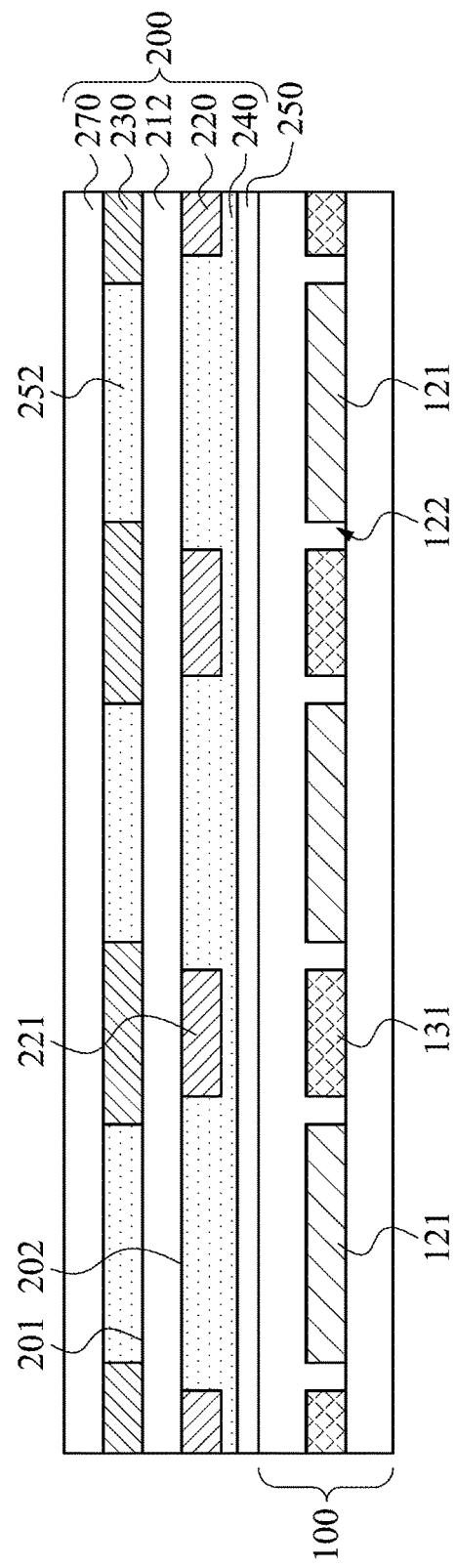
FIG. 5 is a partial sectional view of a touch display device according to one embodiment of the disclosure.

FIG. 5 is a partial sectional view of a touch display device 14 according to one embodiment of the disclosure. In the embodiment, the touch display device 14 of FIG. 5 and the touch display device 13 of FIG. 4 are substantially the same, except that the light-shading pattern 230 is disposed between the protective cover 270 and the transparent substrate 212, and the transparent substrate 212 is disposed between the sensing electrode layer 220 and the light-shading pattern 230. For example, the sensing electrode layer 220 is directly formed on the rear surface 202 of the transparent substrate 212, the light-shading pattern 230 is directly formed on the front surface 201 of the transparent substrate 212, and is directly disposed between the protective cover 270 and the transparent substrate 212. Specifically, the transparent substrate 212 can be selected as a flexible film. After the sensing electrode layer 220 and the light-shading pattern 230 are formed on the rear surface 202 and the front surface 201 of the transparent substrate 212, respectively, the transparent substrate 212 is attached on one surface of the protective cover 270 through an adhesive layer 252 (e.g., adhesive or other similar materials). However, the disclosure is not limited that the transparent substrate 212 must be the flexible film.

Furthermore, since the electrode parts 221 of the sensing electrode layer 220 are hidden beneath the light-shading pattern 230, besides the light-transmissive material as described above, the sensing electrode layer 220 also can be selected as metal material. However, in another embodiment, once a hardness of the transparent substrate is not enough, the outer layer described above can be selected as a hard coat layer. Thus, the hard coat layer can be attached on the transparent substrate with an adhesive layer for protecting the transparent substrate and the light-shading pattern. However, the disclosure is not limited thereto.

FIG. 6 is a partial sectional view of a touch display device 15 according to one embodiment of the disclosure. In the embodiment, the touch display device 15 of FIG. 6 and the touch display device 13 of FIG. 4 are substantially the same, except that both of the light-shading pattern 230 and the sensing electrode layer 220 are stacked mutually to be interposed between the protective cover 270 and the transparent substrate 212, and the light-shading pattern 230 is disposed between the sensing electrode layer 220 and the transparent substrate 212. For example, the sensing electrode layer 220 is directly disposed on one surface of the protective cover 270 facing towards the transparent substrate 212, the light-shading pattern 230 is directly disposed between the front surface 201 of the transparent substrate 212 and the sensing electrode layer 220, and the sensing electrode layer 220 is directly disposed between the protective cover 270 and the light-shading pattern 230. Thus, because both of the sensing electrode layer 220 and the light-shading pattern 230 are disposed on one side of the transparent substrate 212 opposite to the organic light emitting diode display panel 100, thus, when the touch panel 200 and the organic light emitting diode display panel 100 are pressed together into one piece, protruding structures of the sensing electrode layer 220 and the light-shading pattern 230 located over the transparent substrate 212 will not contact with the organic light emitting diode display panel 100 and not further damage the organic light emitting diode unit of the organic light emitting diode display panel 100 so that the touch panel 200 may be more easily coupled on the organic light emitting diode display panel 100, thereby reducing the defective rate of the finished product. However, in another embodiment, once a hardness of the transparent substrate is not enough, the outer layer described above can be selected as a hard coat layer. Thus, the hard coat layer can be attached on the transparent substrate with an adhesive layer for protecting the transparent substrate and the sensing electrode layer. However, the disclosure is not limited thereto.

FIG. 7 is a partial sectional view of a touch display device 16 according to one embodiment of the disclosure. In the embodiment, the touch display device 16 of FIG. 7 and the touch display device 15 of FIG. 6 are substantially the same, except that the light-shading pattern 230 of FIG. 7 is disposed between the sensing electrode layer 220 and the protective cover 270, the sensing electrode layer 220 is disposed between the light-shading pattern 230 and the transparent substrate 212. For example, the sensing electrode layer 220 is directly disposed on the front surface 201 of the transparent substrate 212. For example, the light-shading pattern 230 is directly disposed on one surface of the protective cover 270 facing towards the transparent substrate 212, and directly disposed between the protective cover 270 and the sensing electrode layer 220. The sensing electrode layer 220 is directly disposed on the front surface 201 of the transparent substrate 212, and directly disposed between the transparent substrate 212 and the light-shading pattern 230. However, in another embodiment, once a hardness of the transparent substrate is not enough, the outer layer described above can be selected as a hard coat layer. Thus, the hard coat layer can be attached on the transparent substrate with an adhesive layer for protecting the transparent substrate and the sensing electrode layer. However, the disclosure is not limited thereto.

Figure 8:
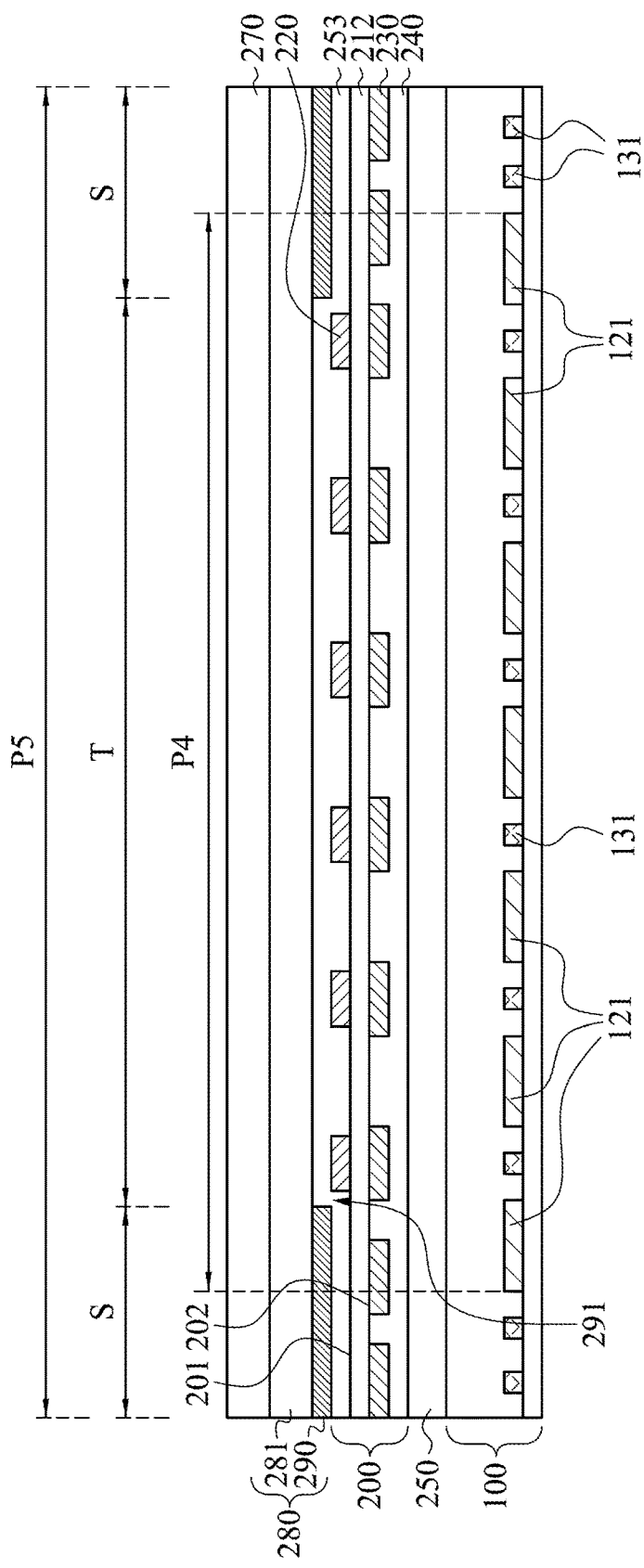
FIG. 8 is a sectional view of a touch display device according to one embodiment of the disclosure.

FIG. 8 is a sectional view of a touch display device 17 according to one embodiment of the disclosure. In the embodiment, the touch display device 17 of FIG. 8 and the touch display device 10 of FIG. 4 are substantially the same, except that the touch display device 17 further includes a decoration film 280, and the decoration film 280 is disposed between the protective cover 270 and the transparent substrate 212. The decoration film 280 includes a main body layer 281 and a black matrix pattern 290. The black matrix pattern 290 is disposed on one surface of the main body layer 281, for example, the black matrix pattern 290 is disposed on one surface of the main body layer 281 facing the transparent substrate 212. The transparent substrate 212 is defined with a touch sensing area T and a surrounding area S surrounding the touch sensing area T. The touch sensing area T is substantially located at a central zone of the transparent substrate 212, corresponded to the active area AA of the organic light emitting diode display panel 100, and has a size which is the same or approximately the same to the active area AA. The surrounding area S is exactly or approximately corresponded to four lateral edges of the transparent substrate 212. The surrounding area S adjoins the touch sensing area T. The surrounding area S is exactly or approximately corresponded to the non-display area NA of the organic light emitting diode display panel 100. The sensing electrode layer 220 is only configured in the touch sensing area T, rather than in the surrounding area S. The black matrix pattern 290 is only configured in the surrounding area S, rather than in the touch sensing area T. Generally, the black matrix pattern 290 is shown as a square ring shape (not shown in figures) on the main body layer 281, and surrounds to form a light-transmitting area 291 therein. The light-transmitting area 291 is corresponded to the touch sensing area T, and has a size which is the same or approximately the same to the active area AA. An orthogonal projection P4 of a range covering all of the organic light emitting diode units 121 projected onto the main body layer 281 is completely in the light-transmitting area 291, on the other words, all of the organic light emitting diode units 121 are allowed to emit outwardly through the light-transmitting area 291. The light-shading pattern 230 covers both of the black matrix pattern 290 and the light-transmitting area 291, on the other words, an orthogonal projection P5 of the light-shading pattern 230 projected onto the main body layer 281 is located on both of the black matrix pattern 290 and the light-transmitting area 291. In the embodiment, the decoration film 280 is bonded to the transparent substrate through an adhesive layer 253. More specifically, a part of the adhesive layer 253 in the surrounding area S is directly attached to the black matrix pattern 290 and the front surface 201 of the transparent substrate 212, and another part in the touch sensing area T is directly attached to the main body layer 281 and the front surface 201 of the transparent substrate 212. In one embodiment, the black matrix pattern 290 and the light-shading pattern 230 can be made by the same material; however, in another embodiment, the black matrix pattern 290 and the light-shading pattern 230 can be made by different materials. For example, the black matrix pattern 290 is made of black ink (e.g., opaque material), and the light-shading pattern 230 is made of a low light-transmitting material (e.g., non-opaque material).

It is noted, the above-described feature of the touch display device 17 of FIG. 8 may also be followed by the embodiments of FIG. 2A to FIG. 7 above, that is, the touch panel 200 of the touch display device 17 of FIG. 8 also can be modified to be any touch panel 200 of FIG. 2A to FIG. 7.

Figure 9:
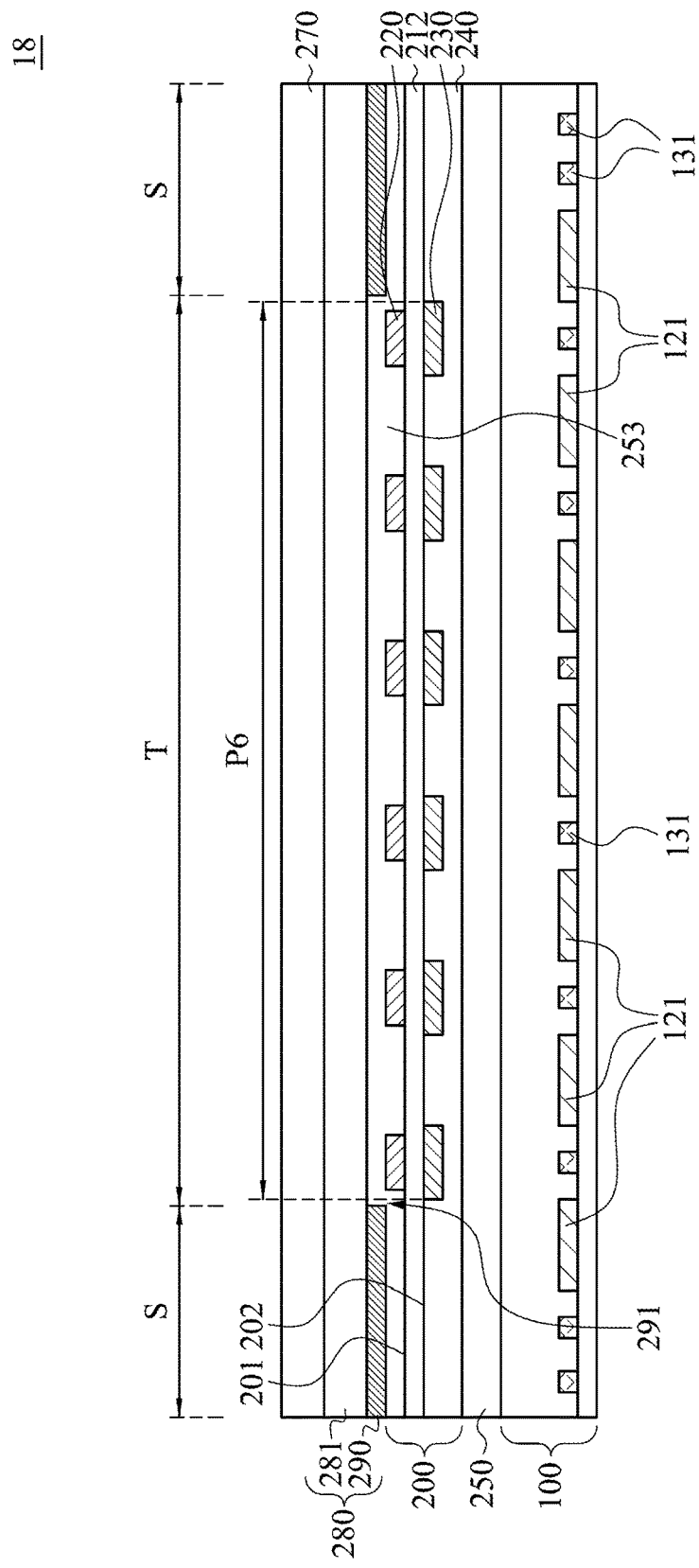
FIG. 9 is a sectional view of a touch display device according to one embodiment of the disclosure.

FIG. 9 is a sectional view of a touch display device 18 according to one embodiment of the disclosure. In the embodiment, the touch display device 18 of FIG. 9 and the touch display device 17 of FIG. 8 are substantially the same, except that an orthogonal projection P6 of the light-shading pattern 230 projected onto the decoration film 280 is only located in the light-transmitting area 291. Thus, since the black matrix pattern 290 located on the decoration film 280 not only conceals periphery lines of the organic light emitting diode display panel 100, but also conceals any object located within the surrounding area S. Thus, the light-shading pattern 230 can be selected not to be configured in the surrounding area S of the transparent substrate 212 so as to save the material cost of the light-shading pattern 230.

Furthermore, in one embodiment, after the transparent substrate 212 is applied with a glass adhesive on a periphery area of the transparent substrate 212, the transparent substrate 212 is pressed against a lower substrate 102 of an organic light emitting diode display through a high temperature lamination process. However, at this moment, a part of the light-shading pattern 230 located at an edge of the transparent substrate 212 may be deteriorated or damaged due to high temperature. Thus, the light-shading pattern 230 in the embodiment of FIG. 9 which is selected to be only disposed in the light-transmitting area 291 will prevent the light-shading pattern 230 from being destroyed by the high temperature of the edge of the transparent substrate 212, or from being deteriorated due to high temperature.

It is noted, the above-described feature of the touch display device 18 of FIG. 9 may also be followed by the embodiments of FIG. 2A to FIG. 7 above, that is, the touch panel 200 of the touch display device 18 of FIG. 9 also can be modified to be any touch panel 200 of FIG. 2A to FIG. 7.

Figure 10:
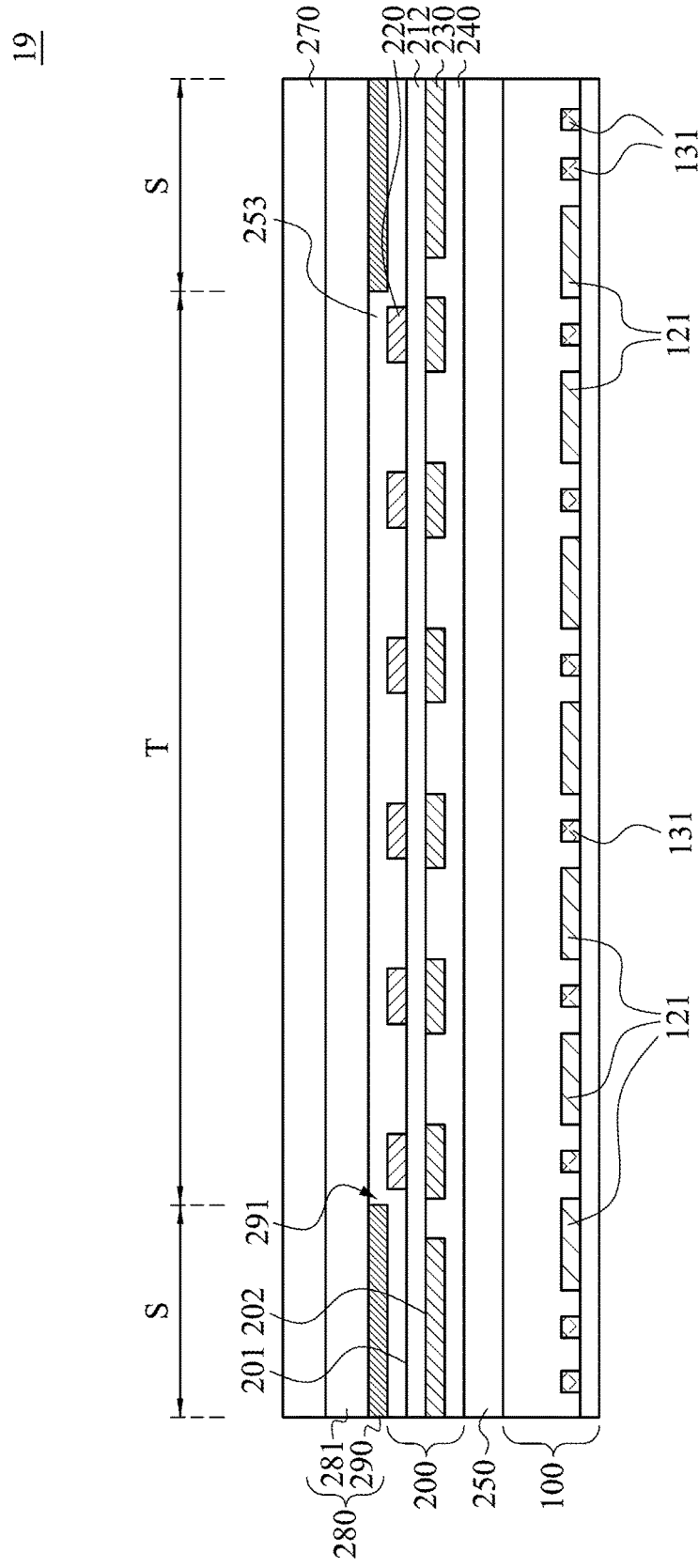
FIG. 10 is a sectional view of a touch display device according to one embodiment of the disclosure.

FIG. 10 is a sectional view of a touch display device 19 according to one embodiment of the disclosure. In the embodiment, the touch display device 19 of FIG. 10 and the touch display device 17 of FIG. 8 are substantially the same, except that the light-shading pattern 230 of FIG. 10 includes an insulating material with a melting point between 400° C.

and 600° C. In the embodiment, a top view of the light-shading pattern 230 located approximately at the edges of the transparent substrate 212 is shown as a square ring shape, and a width of each side of the square ring shape (refer to the width of the left or right part of the surrounding area S in FIG. 10) is substantially the same or smaller than the width of the black matrix pattern 290. Thus, since the light-shading pattern 230 has is with high temperature resistance characteristic, when the transparent substrate 212 is pressed against the lower substrate 102 of the organic light-emitting display through the high temperature lamination process, the part of the light-shading pattern 230 located at the edge of the transparent substrate 212 will not be deteriorated or damaged due to high temperature, and the part of the light-shading pattern 230 located at the edge of the transparent substrate 212 can be completely located at the surrounding area S of the transparent substrate 212 so as to enhance the light-blocking ability of the reflected lights. Also, in another embodiment, when the light-shading pattern 230 includes a material with high temperature resistant characteristics, the aforementioned decoration film 280 can be omitted, that is, the touch display device does not need to configure the decoration film 280.

It is noted, the above-described feature of the touch display device 19 of FIG. 10 may also be followed by the embodiments of FIG. 2A to FIG. 7 above, that is, the touch panel 200 of the touch display device 19 of FIG. 10 also can be modified to be any touch panel 200 of FIG. 2A to FIG. 7.

In addition, in all of the above embodiments, the touch panel 200 is not limited to be in a capacitive type or a resistive type. However, the disclosure is not limited thereto. Regarding to the architecture of the touch panel 200, the touch panel 200 is not limited in types, for example, the touch panel 200 can be made in a single layer type (OLS), a single-sided transparent conductive film structure (e.g., single indium titanium oxide, SITO), a double-sided touch panel (e.g., double Indium titanium oxide, DITO) etc. In the disclosure, these architectures are not intended to limit the scope of the disclosure and are not to be interpreted as limiting the disclosure.

Figure 11:
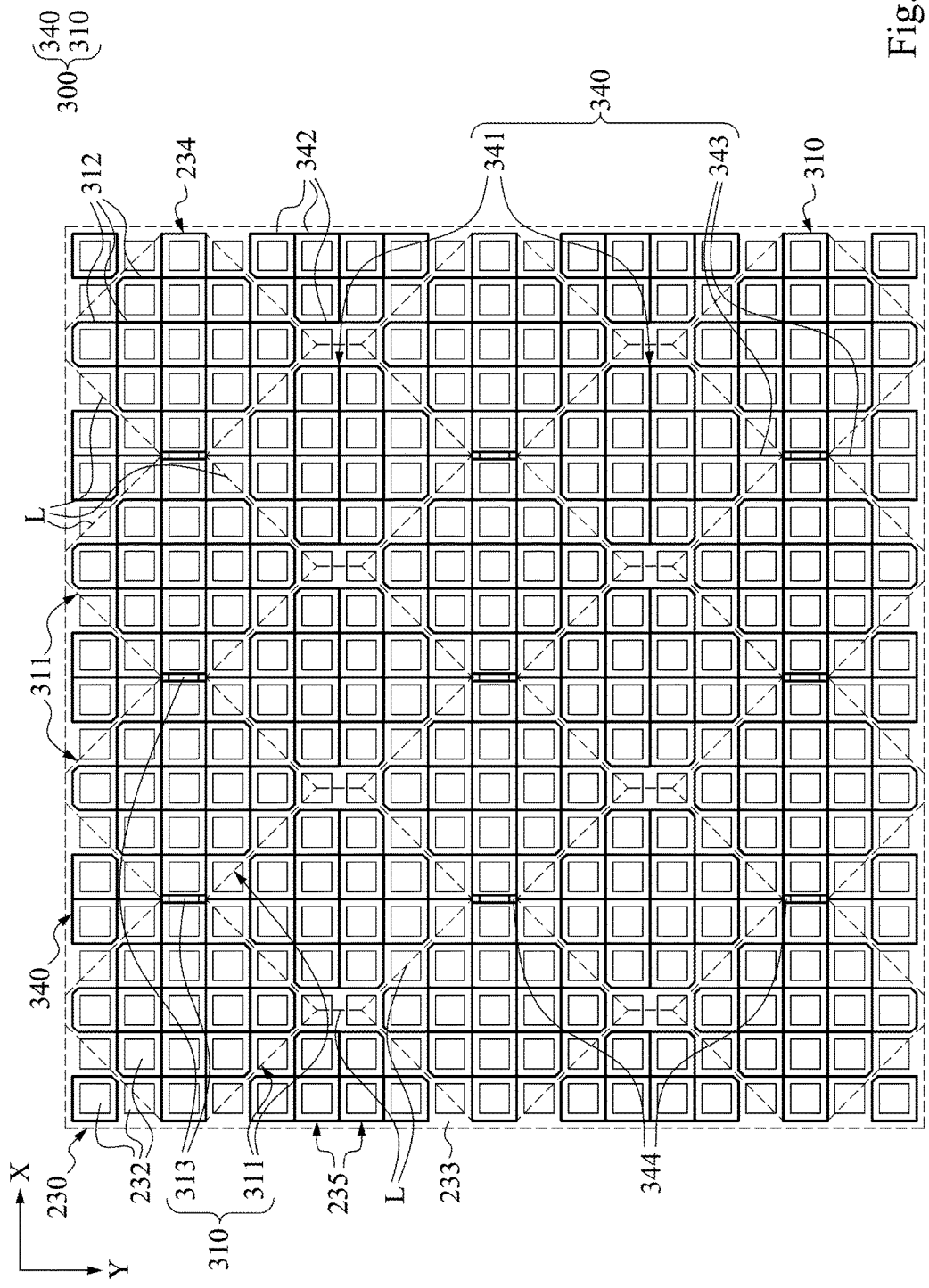
FIG. 11 is a partial bottom view of a touch panel according to one embodiment of the disclosure.

FIG. 11 is a partial bottom view of a touch panel according to one embodiment of the disclosure. The touch panel of FIG. 11 can be adopted in the aforementioned embodiment in which the sensing electrode layer 220 and the light-shading pattern 230 of the touch panel 200 are collectively disposed on the same surface (e.g., rear surface 202) of the transparent substrate 210. The sensing electrode layer 300 (i.e., the sensing electrode layer 220 of the aforementioned touch panel 200) includes a plurality of first axial electrode strings 310 and a plurality of second axial electrode strings 340. The first axial electrode strings 310 and the second axial electrode strings 340 are respectively connected to a control circuit (not shown in figures) so as to send out touch signals. The first axial electrode strings 310 are arranged abreast in parallel on the light-shading pattern 230 (i.e., the mesh structure in FIG. 11), and directly contacted with the light-shading pattern 230. The second axial electrode strings 340 are arranged abreast in parallel on the light-shading pattern 230, and directly contacted with the light-shading pattern 230. A long axial direction (e.g., X-axis) of each of the first axial electrode strings 310 and a long axial direction (e.g., Y-axis) of each of the second axial electrode strings 340 are orthogonal to each other. The first axial electrode strings 310 and the second axial electrode strings 340 are staggered on the light-shading pattern 230 in a checkerboard arrangement, that is, each of the first axial electrode strings 310 is overlapped with all of the second axial electrode strings 340 in the X-axis, and each of the second axial electrode strings 340 is overlapped with all of the first axial electrode strings 310 in the Y-axis. Each of the first axial electrode strings 310 is provided with a plurality of first sensing electrode 311 and a plurality of first connecting lines 313 in which each of the first sensing electrodes 311 is shown as one kind of mesh structure (e.g., a metal mesh) and each of the first connecting lines 313 is connected to any two neighboring ones of the first sensing electrodes 311. Each of the second axial electrode strings 340 is provided with a plurality of second sensing electrode 341 and a plurality of second connecting lines 343 in which each of the second sensing electrodes 341 is shown as another kind of mesh structure (e.g., a metal mesh) and each of the second connecting lines 343 is connected to any two neighboring ones of the second sensing electrodes 341. Each of the first connecting lines 313 overlaps across the second connecting lines 343 through an insulated bridging layer 344. Each of the insulated bridging layers 344 is disposed between one of the first connecting lines 313 and one of the second connecting lines 343, only disposed in an interval space (i.e., a position where the non-pixel region NP is overlapped with) defined between the light-transmitting openings 232, and electrically insolated with one of the aforementioned first connecting lines 313 and the second connecting lines 343 so as to configure the first axial electrode strings 310 and the second axial electrode strings 340 which are insulated and orthogonal to each other. The light-shading pattern 230 in the embodiment is a coating layer 233 having a plurality of the light-transmitting openings 232 thereon, and the light-transmitting openings 232 are spaced and arranged in a matrix arrangement so that the light-transmitting openings 232 are arranged to form a matrix made of rows and columns. The sensing electrode layer 300 is only stacked on the light-shading pattern 230 at an interval space defined between the light-transmitting openings 232, that is, the first axial electrode strings 310 (i.e., first sensing electrodes 311 and the first connecting lines 313) and the second axial electrode strings 340 (i.e., second sensing electrodes 341 and the second connecting lines 343) of the sensing electrode layer 300 are configured to be arranged at the interval space defined between the light-transmitting openings 232, rather than over any of the light-transmitting openings 232. More particularly, each of the first sensing electrodes 311 includes a plurality of first wire frame units 312 which are planarly united together so that the first wire frame units 312 of the first sensing electrode 311 are distributed on a certain number of the rows and the columns of the matrix described above, and on the interval space defined between the light-transmitting openings 232 only. The first wire frame units 312 which are planarly united together, for example, can be roughly outlined to be a rhombus or square mesh structure by a virtual contour L in FIG. 11. In each of the first sensing electrodes 311, a middle one 234 of the certain number of the rows or the columns of the matrix is maximum in quantity, and the quantity of the first wire frame units 312 of each of two opposite parts of the certain number of the rows or the columns of the matrix from the middle one 234 to the end of the certain number of the rows or the columns of the matrix is decreased progressively with an arithmetic series. Each of the first wire frame units 312 is shown in a square ring shape, and each of the first wire frame units 312 continually surrounds one of the light-transmitting openings 232 at the interval space defined between the light-transmitting openings 232. Each of the first connecting lines 313 is connected to any two neighboring ones of the first sensing electrodes 311 at the interval space defined between the light-transmitting openings 232.

Each of the second sensing electrodes 341 includes a plurality of second wire frame units 342 which are planarly united together so that the second wire frame units 342 of the second sensing electrode 341 are distributed on a certain number of the rows and the columns of the matrix described above, and on the interval space defined between the light-transmitting openings 232 only. The second wire frame units 342 which are planarly united together, for example, can be roughly outlined to be a rhombus or square mesh structure by another virtual contour L in FIG. 11.

In each of the second sensing electrodes 341, a middle one 235 of the certain number of the rows or the columns of the matrix is maximum in quantity, and the quantity of the second wire frame units 342 of each of two opposite parts of the certain number of the rows or the columns of the matrix from the middle one 235 to the end of the certain number of the rows or the columns of the matrix is decreased progressively with an arithmetic series so that each of the second sensing electrodes 341 is substantially shaped in a rhombic or square contour. Each of the second wire frame units 342 is shown in a square ring shape, and continually surrounds one of the light-transmitting openings 232 at the interval space defined between the light-transmitting openings 232. Each of the second connecting lines 343 is connected to any two neighboring ones of the second sensing electrodes 341 at the interval space defined between the light-transmitting openings 232. It is noted, the virtual contour L described above in FIG. 11 is only used for roughly outlining the contours of each of the first sensing electrodes 311 and the second sensing electrodes 341.

In another embodiment, the touch panel of FIG. 11 can be adopted in the aforementioned embodiment in which the sensing electrode layer 220 and the light-shading pattern 230 of the touch panel 200 are respectively disposed on the opposite surfaces of the transparent substrate 210 in FIG. 4 and FIG. 5.

Figure 12A:
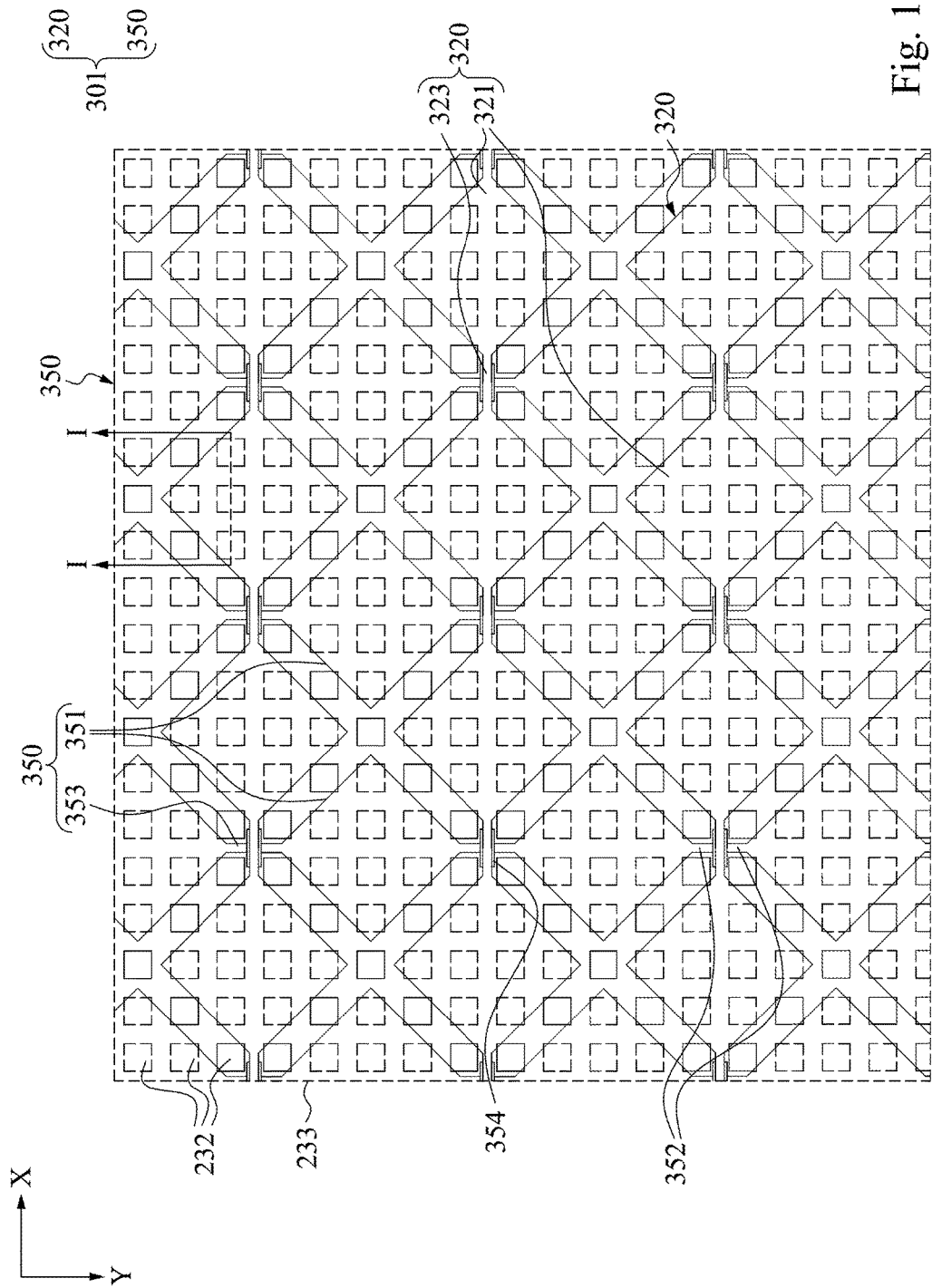
FIG. 12A is a partial bottom view of a touch panel according to one embodiment of the disclosure.
Figure 12B:
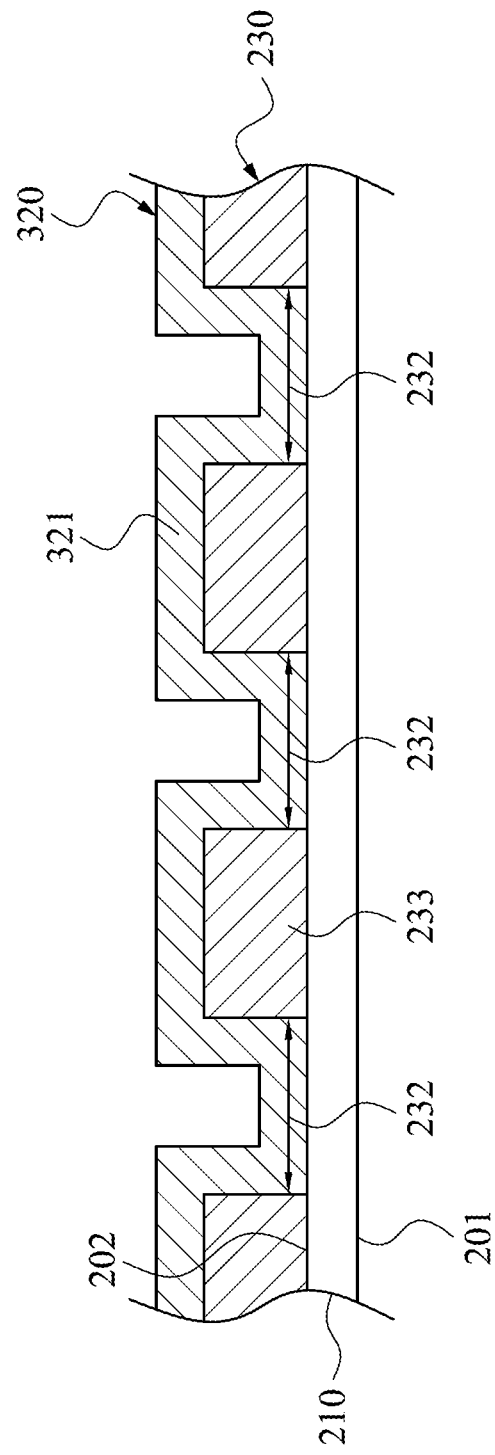
FIG. 12B is a cross sectional view of FIG. 12A viewed along a line I-I.

FIG. 12A is a partial bottom view of a touch panel according to one embodiment of the disclosure. FIG. 12B is a cross sectional view of FIG. 12A viewed along a line I-I. The touch panel of FIG. 12 can be adopted in the aforementioned embodiment in which the sensing electrode layer 220 and the light-shading pattern 230 are collectively disposed on the same surface (e.g., rear surface 202) of the transparent substrate 210, and one of the differences between the touch display device of FIG. 12A and the touch display device of FIG. 11 is that, as shown in FIG. 12A and FIG. 12B, the first sensing electrodes 321 of the first axial electrode strings 320 and the second sensing electrodes 351 of the second axial electrode strings 350 of the sensing electrode layer 301 are respectively solid patterns, rather than the wire frame units surrounding the corresponding light-transmitting openings 232. The first sensing electrodes 321, the first connecting lines 323, the second sensing electrodes 351 and the second connecting lines 353 are able to be directly disposed in one of the light-transmitting openings 232, across any of the light-transmitting openings 232, and at the interval space defined between the light-transmitting openings 232. Also, the insulated bridging layers 354 are located at the interval space defined between the light-transmitting openings 232.

For example, as shown in FIG. 12B, one part of each of the first sensing electrodes 321 is directly stacked on the coating layer 233 of the light-shading pattern 230, and another part of the each of the first sensing electrodes 321 is directly sunken to fill within the light-transmitting openings 232 formed on the coating layer 233 so that each of the first sensing electrodes 321 corresponding to the light-transmitting openings 232 is formed with a waved top surface.

More specifically, in the embodiment, the first sensing electrodes 321 and the second sensing electrodes 351 of the sensing electrode layer 301 respectively include light-transmissive materials, and the first sensing electrodes 321 and the second sensing electrodes 351 are respectively shown as a rectangular solid pattern in outline. Each of the first connecting lines 323 is connected to one rectangular end corner 322 of each of two neighboring ones of the first sensing electrodes 321. Each of the second connecting lines 353 is connected to one rectangular end corner 352 of two neighboring ones of the second sensing electrodes 351, thereby decreasing the complexity of the sensing electrode layer 301 so as to reduce the manufacturing cost and time.

In another embodiment, the touch panel of FIG. 12A can be adopted in the aforementioned embodiment in which the sensing electrode layer 220 and the light-shading pattern 230 are respectively disposed on the opposite surfaces of the transparent substrate 210 in FIG. 4 and FIG. 5.

Figure 13:
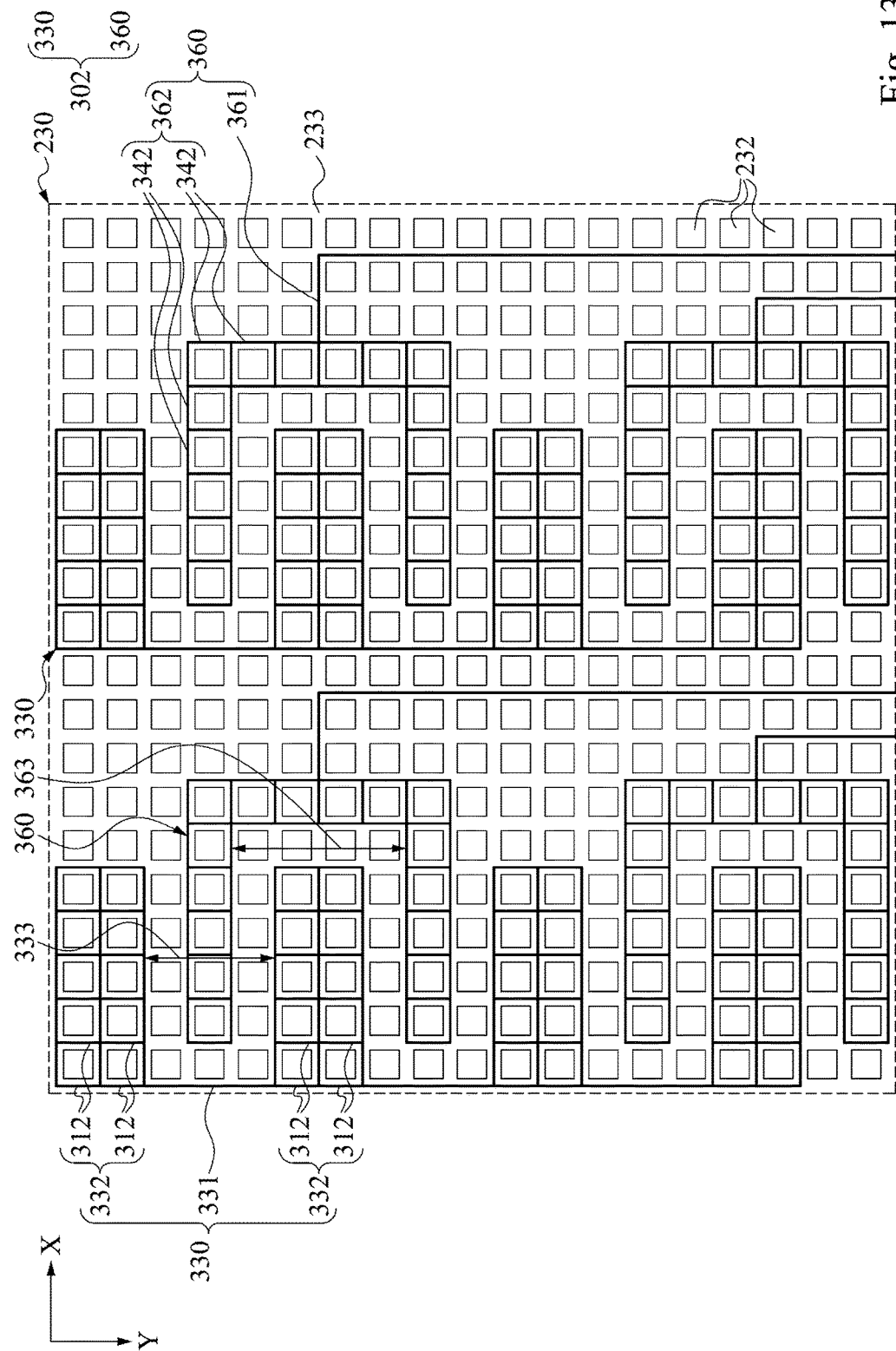
FIG. 13 is a partial bottom view of a touch panel according to one embodiment of the disclosure.

FIG. 13 is a partial bottom view of a touch panel according to one embodiment of the disclosure. The touch panel of FIG. 13 can be adopted in the aforementioned embodiment in which the sensing electrode layer 220 and the light-shading pattern 230 are collectively disposed on the same surface of the transparent substrate 210. The similar part of the touch display device of FIG. 13 and the touch display device of FIG. 11 is that, the first axial electrode strings 330 and the second axial electrode strings 360 are still located at the interval space defined between the light-transmitting openings 232, and still not across any of the light-transmitting openings 232. However, one of the differences between the touch panel of FIG. 13 and the touch panel of FIG. 11 is that, the first axial electrode strings 330 and the second axial electrode strings 360 are alternated to each other and complementarily arranged on the light-shading pattern 230. Specifically, all first axial electrode strings 330 and all second axial electrode strings 360 are mutually formed to be a single-layer type structure of the touch electrode. Each of the first axial electrode strings 330 includes a first sensing main wire 331 and a plurality of finger-shaped electrodes 332. The finger-shaped electrodes 332 are spaced and arranged abreast, and are respectively connected to the same lateral side of the first sensing main wire 331. A plurality of first breaches 333 are defined by the finger-shaped electrodes 332 and the first sensing main wire 331. Each of the second axial electrode strings 360 includes a second sensing main wire 361 and a horseshoe-shaped electrode electrode 362. One end of the second sensing main wire 361 is connected to the horseshoe-shaped electrode 362; the other end of the second sensing main wire 361 is connected to a control circuit (not shown in figures). The horseshoe-shaped electrodes 362 are separately distributed on the light-shading pattern 230. Two parts of each of the horseshoe-shaped electrodes 362 exactly extend into two neighboring ones of the first breaches 333, respectively. Namely, one of the finger-shaped electrodes 332 extends into a second breach 363 defined by the corresponding horseshoe-shaped electrode 362. Specifically, each of the finger-shaped electrodes 332 includes a plurality of first wire frame units 312 so that the first wire frame units 312 are distributed on a certain number of rows and columns of the matrix described above, and are located at the interval space defined between the light-transmitting openings 232 only.

In another embodiment, the touch panel of FIG. 13 can be adopted in the aforementioned embodiment in which the sensing electrode layer 220 and the light-shading pattern 230 are respectively disposed on the opposite surfaces of the transparent substrate 210 in FIG. 4 and FIG. 5.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A touch display device, comprising:
    an organic light emitting diode display panel, comprising:
        an organic light emitting diode array comprising a plurality of pixel regions and a non-pixel region surrounding the pixel regions, each of the pixel regions has an organic light emitting diode unit thereon; and
        a driving circuit for receiving signals and driving the organic light emitting diode units to emit light, wherein the driving circuit is provided with at least one metal wire, and the at least one metal wire is located in the non-pixel region; and
    a touch panel, comprising:
        a transparent substrate coupling to the organic light emitting diode display panel;
        a sensing electrode layer disposed on the transparent substrate; and
        a light-shading pattern disposed on the transparent substrate, wherein an orthogonal projection of the light-shading pattern projected onto the organic light emitting diode array is in the non-pixel region, and at least overlap with the at least one metal wire, and the light-shading pattern and the sensing electrode layer overlap each other.

2. The touch display device of claim 1, wherein a pattern of the light-shading pattern is identical to a pattern of the non-pixel region formed on the organic light emitting diode array.

3. The touch display device of claim 1, wherein a pattern of the light-shading pattern is identical to a pattern of the at least one metal wire.

4. The touch display device of claim 1, wherein the light-shading pattern is formed with a plurality of light-transmitting openings, and the light-transmitting openings are spaced and arranged according to a matrix arrangement, wherein an orthogonal projection of each of the organic light emitting diode units projected onto the transparent substrate is in one of the light-transmitting openings.

5. The touch display device of claim 1, wherein the light-shading pattern is formed by a plurality of light-shading lines which extend in a first direction and a second direction, respectively so as to define a plurality of light-transmitting openings, wherein the first direction and the second direction are orthogonal to each other.

6. The touch display device of claim 5, wherein a gap is formed between any two neighboring ones of the organic light emitting diode units, the at least one metal wire has a first line width, any of the light-shading lines has a second line width, the second line width is not smaller than the first line width, and is not greater than the gap.

7. The touch display device of claim 1, wherein the light-shading pattern is disposed on one surface of the transparent substrate facing towards the organic light emitting diode array.

8. The touch display device of claim 7, wherein the light-shading pattern is disposed between the transparent substrate and the sensing electrode layer.

9. The touch display device of claim 7, wherein the sensing electrode layer is disposed between the transparent substrate and the light-shading pattern.

10. The touch display device of claim 1, wherein the touch panel further comprises an outer layer, the outer layer covers one surface of the transparent substrate opposite to the organic light emitting diode array, wherein the outer layer is one of a protective cover and a hard coat layer.

11. The touch display device of claim 10, wherein the transparent substrate is disposed between the sensing electrode layer and the light-shading pattern.

12. The touch display device of claim 11, wherein the sensing electrode layer is disposed between the outer layer and the transparent substrate.

13. The touch display device of claim 11, wherein the light-shading pattern is disposed between the outer layer and the transparent substrate.

14. The touch display device of claim 10, wherein the light-shading pattern and the sensing electrode layer are stacked between the outer layer and the transparent substrate.

15. The touch display device of claim 14, wherein the light-shading pattern is disposed between the sensing electrode layer and the transparent substrate.

16. The touch display device of claim 14, wherein the sensing electrode layer is disposed between the light-shading pattern and the transparent substrate.

17. The touch display device of claim 1, further comprising:
    a protective cover; and
    a decoration film disposed between the protective cover and the transparent substrate, comprising a main body layer and a black matrix pattern disposed on one surface of the main body layer, and surrounding to form a light-transmitting area on the main body layer,
    wherein an orthogonal projection of the light-shading pattern projected onto the decoration film is completely in the light-transmitting area.

18. The touch display device of claim 1, further comprising:
    a protective cover; and
    a decoration film disposed between the protective cover and the transparent substrate, comprising a main body layer and a black matrix pattern disposed on one surface of the main body layer, and surrounding to form a light-transmitting area on the main body layer,
    wherein an orthogonal projection of the light-shading pattern projected onto the decoration film is disposed on both of the black matrix pattern and the light-transmitting area.

19. The touch display device of claim 1, wherein the light-shading pattern is formed with a plurality of light-transmitting openings, and the light-transmitting openings are spaced and arranged according to a matrix arrangement, wherein the sensing electrode layer covers interval spaces defined between the light-transmitting openings only.

20. The touch display device of claim 1, wherein the light-shading pattern is formed with a plurality of light-transmitting openings, and the light-transmitting openings are spaced and arranged according to a matrix arrangement, wherein the sensing electrode layer covers at least one of the light-transmitting openings and interval spaces defined between the light-transmitting openings.

\* \* \* \* \*